(12) United States Patent
Choi et al.

(10) Patent No.: US 7,780,493 B2
(45) Date of Patent: Aug. 24, 2010

(54) METHOD OF MANUFACTURING FLAT PANEL DISPLAY DEVICE

(75) Inventors: Dong-Soo Choi, Suwon-si (KR); Jang-Hwan Shin, Suwon-si (KR); Young-Cheol Joo, Suwon-si (KR); Jin-Woo Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 307 days.

(21) Appl. No.: 11/788,587

(22) Filed: Apr. 19, 2007

(65) Prior Publication Data

US 2008/0171485 A1 Jul. 17, 2008

(30) Foreign Application Priority Data

Jan. 12, 2007 (KR) .................... 10-2007-0003961

(51) Int. Cl.
*H01J 9/26* (2006.01)
(52) U.S. Cl. ......................................... 445/25; 313/512
(58) Field of Classification Search .................. 445/23, 445/24, 25; 313/512; 65/41, 43, 117
See application file for complete search history.

(56) References Cited

U.S. PATENT DOCUMENTS

| 6,373,025 | B1 * | 4/2002 | Takeuchi et al. ........ 219/121.64 |
| 6,562,698 | B2 | 5/2003 | Manor |
| 7,371,143 | B2 * | 5/2008 | Becken et al. ................. 445/25 |
| 2005/0001545 | A1 * | 1/2005 | Aitken et al. ................. 313/512 |
| 2006/0023058 | A1 * | 2/2006 | Tanaka ........................ 347/224 |
| 2007/0007894 | A1 | 1/2007 | Aitken et al. |
| 2007/0128774 | A1 * | 6/2007 | Yamada ....................... 438/149 |

FOREIGN PATENT DOCUMENTS

| JP | 07-129909 | 5/1995 |
| JP | 2000-149783 | 5/2000 |
| JP | 2001-092376 | 4/2001 |
| JP | 2001-326194 | 11/2001 |
| JP | 2002-224870 | 8/2002 |
| JP | 2004-155639 | 6/2004 |
| JP | 2006-181757 | 7/2006 |
| KR | 10 2000 0077111 A | 12/2000 |
| KR | 10 2001 0007100 | 1/2001 |
| KR | 10 2003 0094917 A | 12/2003 |
| KR | 10 2004 0058160 A | 7/2004 |
| KR | 10 2006 0135732 A | 12/2006 |

* cited by examiner

*Primary Examiner*—Joseph L Williams
*Assistant Examiner*—Andrew J Coughlin
(74) *Attorney, Agent, or Firm*—Knobbe Martens Olson & Bear LLP

(57) ABSTRACT

A method of manufacturing a flat panel display device is disclosed. In one embodiment, the method includes: i) forming a plurality of light emitting units on a first substrate, each of the plurality of light emitting units including a light emitting element, ii) providing a second substrate, iii) placing glass frits between the first and second substrates, iv) radiating a first laser beam, having a first intensity, on one of the first and second substrates, wherein the first laser is configured to melt the grass frits and combine the first and second substrates and v) radiating a second laser beam, having a second intensity, on the first irradiated region so as to anneal the first or second substrate, wherein the second intensity is different from the first intensity. According to one embodiment, the substrate cutting quality can be simply improved.

18 Claims, 5 Drawing Sheets

METHOD OF MANUFACTURING FLAT PANEL DISPLAY DEVICE

CROSS-REFERENCE TO RELATED PATENT APPLICATION

This application claims the benefit of Korean Patent Application No. 10-2007-0003961, filed on Jan. 12, 2007, in the Korean Intellectual Property Office, the disclosure of which is incorporated herein in its entirety by reference.

BACKGROUND OF THE INVENTION

1. Field of the Invention

The present invention relates to a method of manufacturing a flat panel display device, and more particularly, to a method of manufacturing a flat panel display device that is sealed by glass frits.

2. Description of the Related Technology

In general, flat panel display devices such as organic light emitting display devices and TFT-LCDs can be made thin and flexible, and thus, much research into such flat panel display devices is being conducted.

Organic light emitting display devices deteriorate as moisture penetrates therein, so that a sealing structure for preventing penetration of moisture is required.

Conventionally, a metal can or a glass substrate that is processed to a cap shape with a groove has been used as a sealing member. The metal can or glass substrate may contain a desiccant in powder form for absorbing moisture once it is sealed. Alternatively, a desiccant film may be attached to the sealing member using, e.g., a double-sided tape. In either case, the sealing member is combined with a substrate, on which a light emitting element is formed, using a UV curable organic sealant or a thermo-curable organic sealant.

When an organic sealant for combining a sealing member with a substrate is used, the resistance against pressure is small, the resistance to moisture penetration is lowered, thereby degrading a sealing effect.

Due to such problems as described above, glass frits with a high resistance to pressure and a good sealing characteristic has been suggested as a substitute for the organic sealant. In this case, a laser can be used to melt the glass frits and reduce a thermal effect on the organic light emitting element. However, in a mass-production process involving forming a plurality of light emitting devices on a single glass and cutting the glass into a plurality of devices, cut faces of the glass may deteriorate due to thermal stress generated by the radiation of the laser.

When melting the glass flit by laser, the temperature instantaneously rises to a high temperature of about 500-600° C., which thermally impacts the glass. Such a thermal impact leads to a deviation in stress between parts of the glass, so that cracks occur in an unintended direction when cutting the glass. As a result, protrusions, particles, etc., are generated on a cut face of the glass.

SUMMARY OF CERTAIN INVENTIVE ASPECTS

One aspect of the present invention provides a method of manufacturing a flat panel display device by combining a substrate and a sealing member via glass frits that are melted by a laser, in which the inferiority of a cut face of the substrate by laser is minimized.

Another aspect of the present invention provides a method of manufacturing a flat panel display device, the method comprising: i) forming a plurality of light emitting units on a surface of a first substrate, each the light emitting units including a light emitting element, ii) preparing a second substrate, iii) applying glass frits on a surface of the first substrate or the second substrate iv) arranging the first and second substrates to face each other so that the glass frits are disposed between the first and second substrates, v) combining the first and second substrates by the glass frits that are melted by radiating a laser having a first intensity and vi) annealing the first or second substrate by radiating a laser having a second intensity onto a region irradiated by the laser having the first intensity, wherein the second intensity is different from the first intensity.

The second intensity may be smaller than the second intensity.

The second intensity may be from about 70% to about 80% of the first intensity.

The annealing of the first or second substrate by the radiation of the laser having the second intensity may be performed in reverse order to the melting of the glass frits by the radiation of the laser having the first intensity.

In the forming of the plurality of light emitting units, m light emitting units may be arranged in a first direction, and n light emitting units may be arranged in a second direction, the melting of the glass frits may be performed in the first direction, and the annealing of the first or second substrate by the radiation of the laser having the second intensity may be performed in an opposite direction to the first direction.

In the forming of the plurality of light emitting units, m light emitting units may be arranged in a first direction, and n light emitting units may be arranged in a second direction, the melting of the glass frits may be performed by repeatedly radiating the laser having the first intensity in the second direction and then in the first direction, and the annealing of the first or second substrate may be performed by repeatedly radiating the laser having the second intensity in the second direction and then in an opposite direction to the first direction.

In the melting of the glass frits by radiating the laser having the first intensity and the annealing of the first or second substrate by radiating the laser having the second intensity, the laser having the first intensity and the laser having the second intensity may be radiated onto a number of glass frits corresponding to at least two light emitting units at a time.

In the forming of the plurality of light emitting units, m light emitting units may be arranged in a first direction, and n light emitting units may be arranged in a second direction, the melting of the glass frits may be performed by radiating the laser having the first intensity onto a column of light emitting units in the first direction and then onto a next column of light emitting units in the second direction, and the annealing of the first or second substrate may be performed by radiating the laser having the second intensity in a direction opposite to the melting of the glass frits by the radiation of the laser having the first intensity.

The method may further comprise rotating the first and second substrates by 180° after the combining of the first and second substrates using the laser having the first intensity.

In the combining of the first and second substrates by radiating the laser having the first intensity and the annealing of the first or second substrate by radiating the laser having the second intensity, a laser radiator may be moved in the same direction.

The laser having the first intensity may be radiated onto the first substrate.

The laser having the first intensity may be radiated onto the second substrate.

The laser having the first intensity may be radiated onto the first substrate and the second substrate.

The method may further comprise cutting the first or second substrate so as to separate the light emitting units after the annealing of the first or second substrate.

The at least one light emitting element may be an organic light emitting element.

Another aspect of the invention provides a method of manufacturing a flat panel display device, the method comprising: i) forming a plurality of light emitting units on a first substrate, each of the plurality of light emitting units including a light emitting element, ii) providing a second substrate, iii) placing glass frits between the first and second substrates, iv) radiating a first laser beam, having a first intensity, on one of the first and second substrates, so as to melt the grass frits and combine the first and second substrates and v) radiating a second laser beam, having a second intensity, on an area where the first laser beam has been radiated, so as to anneal the first or second substrate, wherein the second intensity is different from the first intensity.

Still another aspect of the invention provides a flat panel display device manufactured by a method, the method comprising: i) providing first and second substrates, wherein a glass frit is formed on one of the substrates, ii) radiating, during a period of time, a first laser beam which is configured to melt the frit and combine the first and second substrates and iii) radiating, after the period of time, a second laser beam toward at least one of the first and second substrates.

Yet another aspect of the invention provides a method of manufacturing a flat panel display device, the method comprising: i) providing a glass frit between first and second substrates, ii) radiating a first laser beam, having a first intensity, on one of first and second substrates so as to melt the grass frit and combine the first and second substrates and iii) radiating a second laser beam, having a second intensity, on the first radiated region, wherein the second intensity is substantially less than that of the first intensity.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Exemplary embodiments of the present invention will be described in detail with reference to the appended drawings.

Figure 1:
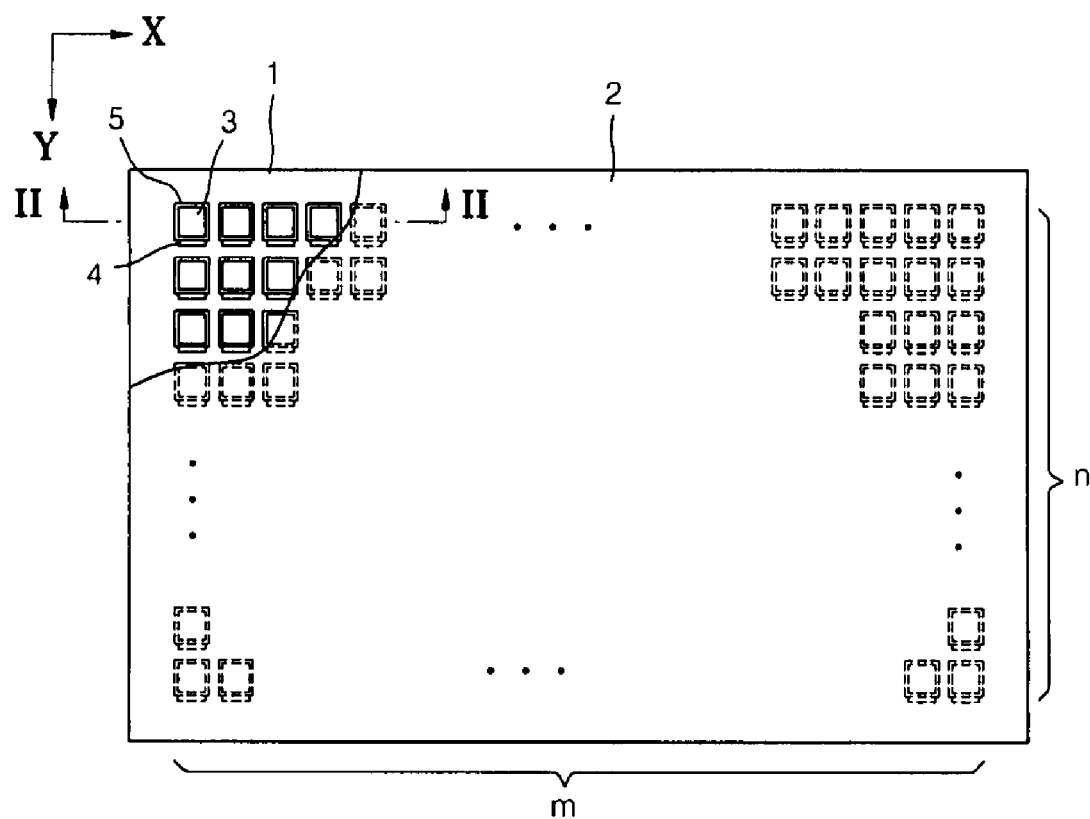
FIG. 1 is a plan view of substrates for a flat panel display device to be manufactured by a method according to an embodiment of the present invention.
Figure 2:
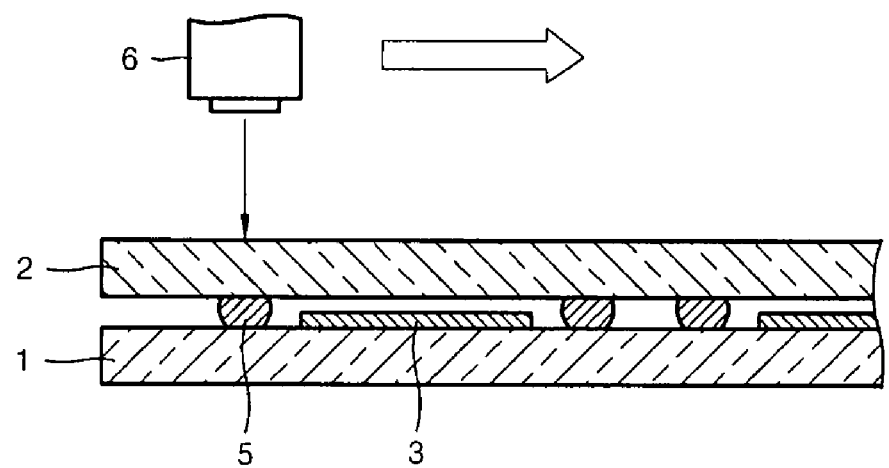
FIG. 2 is a sectional view of the substrates taken along line II-II in FIG. 1.

FIG. 1 is a plan view of substrates for a flat panel display device to be manufactured by a method according to an embodiment of the present invention. FIG. 2 is a sectional view taken along line II-II in FIG. 1.

As shown in FIGS. 1 and 2, a first substrate 1 and a second substrate 2, which are opposite to each other, are prepared. A plurality of light emitting units 3 are formed on a surface of the first substrate 1.

The first substrate 1 and the second substrate may be formed of a transparent glass material, but is not limited thereto.

Each of the light emitting units 3 includes a plurality of light emitting elements. In an embodiment of the present invention, the light emitting units 11 may be organic light emitting units including a plurality of organic light emitting elements.

Figure 4:
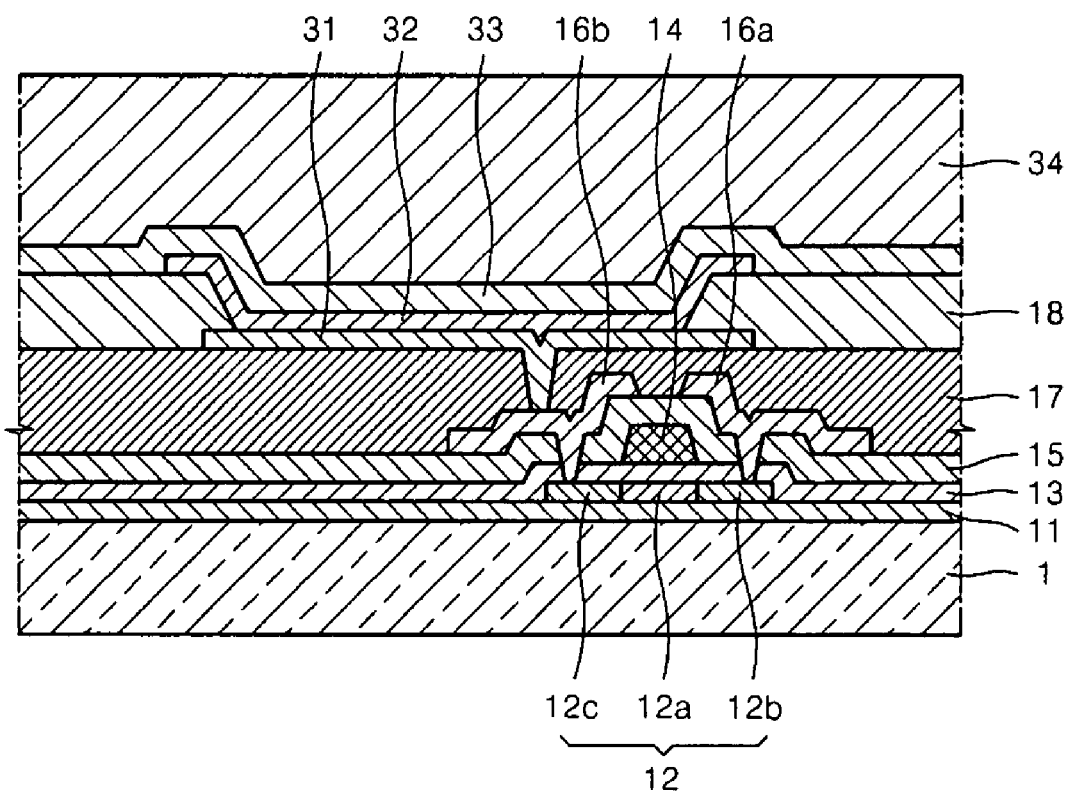
FIG. 4 is a sectional view of an example of a light emitting unit in FIG. 1.

FIG. 4 is a sectional view of an active matrix organic light emitting device as an example of the light emitting unit 11.

As shown in FIG. 4, an insulating layer 11, such as a barrier layer and/or a buffer layer, which prevents diffusion of impurity ions and permeation of moisture or external air and planarizes the surface of the first substrate 1, may be formed on an upper surface of the first substrate 1.

An active layer 12 for a TFT is formed of a semiconductor material on the insulating layer 11, and a gate insulating layer 13 is formed so as to cover the active layer 12. The active layer 12 may be formed of an inorganic semiconductor material, such as amorphous silicon or polysilicon, or an organic semiconductor material. The active layer 12 has a source region 12b, a drain region 12c, and a channel region 12a between the source region 12b and the drain region 12c.

A gate electrode 14 is formed on the gate insulating layer 13, and an interlayer insulating layer 15 is formed so as to cover the gate electrode 4. A source electrode 16a and a drain electrode 16b are formed on the interlayer insulating layer 15. A planarization layer 17 and a pixel-defining layer 18 are sequentially formed so as to cover the source electrode 16a and the drain electrode 16b.

The gate insulating layer 13, the interlayer insulating layer 15, the planarization layer 17, and the pixel-defining layer 18 may be formed of an insulating material in a single- or multilayered structure, and may be formed of an organic material, an inorganic material, or an organic/inorganic composite material.

Such a stacked structure of the TFT as described above is not limited thereto, and the TFT may have various structures.

A pixel electrode 31 of an organic light emitting diode (OLED) is formed on the planarization layer 17, and a pixel-defining layer 18 is formed on the planarization layer 17. A predetermined opening is formed in the pixel-defining layer 18 so as to expose the pixel electrode 31, and an organic emitting layer 32 of the OLED is formed.

The OLED displays predetermined image information by emitting red, green, and blue light according to the flow of current. The OLED includes the pixel electrode 31, which contacts the drain electrode 16b of the TFT via a contact hole, an opposing electrode 33 covering all of the pixels, and the organic emitting layer 32 disposed between the pixel electrode 31 and the opposing electrode 33 to emit light.

The pixel electrode 31 and the opposing electrode 33 are insulated from one another by the organic emitting layer 32, and voltages having different polarities are applied across the pixel electrode 31 and the opposing electrode 33, respectively, to emit light in the organic emitting layer 32.

The organic emitting layer 32 may be formed of a low-molecular weight organic layer or a polymer organic layer. When a low molecular weight organic layer is used, it may be formed as a hole injection layer (HIL), a hole transport layer (HTL), an emitting layer (EML), a hole transport layer (HTL), an emitting layer (EML), an electron transport layer (ETL), an electron injection layer (ETL), etc., having a single layered structure of a stacked composite structure. Examples of organic materials that can be used include copper phthalocyanine (CuPc), N,N'-di(naphthalene-1-yl)-N,N'-diphenyl-benzidine (NPB), tris-8-hydroxyquinoline aluminum (Alq3), etc. The low-molecular weight organic layer may be formed using vacuum deposition. In this case, the hole injection layer, the hole transport layer, the electron transport layer, the electron injection layer, etc. may be common to red, green, and blue pixels. Accordingly, unlike the structure in FIG. 4, these common layers may be formed so as to cover the entire pixels, like the opposing electrode 33.

The pixel electrode 31 functions as an anode, and the opposing electrode 33 functions as a cathode. Alternatively, the polarities of the pixel electrode 31 and the opposing electrode 33 may be reversed.

In a bottom emission type display, in which an image is displayed toward the first substrate 1, the pixel electrode 31 may be a transparent electrode, and the opposing electrode 33 may be a reflective electrode. In this case, the pixel electrode 31 may be formed of a high-work function material, for example, ITO, IZO, ZnO, $In_2O_3$, etc. The opposing electrode 33 may be formed of a small-work function metal, for example, Ag, Mg, Al, Pt, Pd, Au, Ni, Nd, Ir, Cr, Li, Ca, etc.

In a top emission type display, in which an image is displayed toward the opposing electrode 33, the pixel electrode 31 may be formed as a reflective electrode, and the opposing electrode 33 may be formed as a transparent electrode. The reflective electrode for the pixel electrode 31 may include a reflective layer formed of Ag, Mg, Al, Pt, Pd, Au, Ni, Nd, Ir, Cr, Li, Ca, a combination thereof, etc., and a high-work function material, for example, ITO, IZO, ZnO, $In_2O_3$, etc. In addition, the transparent electrode for the opposing electrode 33 may be formed by depositing a small-work function metal, for example, Ag, Mg, Al, Pt, Pd, Au, Ni, Nd, Ir, Cr, Li, Ca, or a combination thereof and forming an auxiliary electrode layer or a bus electrode line thereon using a transparent conductive material, such as ITO, IZO, ZnO, $In_2O_3$, etc.

In a double-side emission type display, both the pixel electrode 31 and the opposing electrode 33 may be formed as transparent electrodes.

Materials for the pixel electrode 31 and the opposing electrode 33 are not limited to the above. For example, the pixel electrode 31 and the opposing electrode 33 may be formed of a conductive organic material, or a conductive paste containing conductive particles, such as Ag, Mg, Cu, etc. When using such a conductive paste, the pixel electrode 31 and the opposing electrode 33 may be formed by inkjet printing. After the inkjet printing, baking is performed to obtain the electrodes.

A passivation layer 34 may be further formed on the opposing electrode 33 in the light emitting unit 3 so as to cover the light emitting unit 3. The passivation layer 34 may be formed of an inorganic material, an organic material, or organic and inorganic materials stacked upon one another.

On the other hand, as shown in FIG. 1, a pad unit 4 connecting each of the light emitting units 3 and an external device may be disposed adjacent to the light emitting unit 3.

m light emitting units 3 and m pad units 4 are formed in a first direction indicated by X, and n light emitting units 3 and n pad units 4 are formed in a second direction indicated by Y. Here, one light emitting unit 3 and one pad unit 4 form a single unit cell. The light emitting unit 3 and the pad unit 4 in each unit cell are adjacent to each other in the second direction indicated by Y.

In one embodiment, a paste of glass frits 5 is applied to a surface of the second substrate facing the first substrate so as to be around each of the light emitting units 3, and is primarily subjected to pre-sintering so as to harden the glass frits 5. Alternatively, the paste of glass frits 5 may be applied to a surface of the first substrate 1 facing the second substrate 2. The paste of glass frits 5 may be applied sequentially applied to each cell using a dispenser, or may be applied simultaneously to all the cells using a screen printing method.

Next, after the second substrate 2 to which the glass frits 5 are applied is aligned with and the first substrate 1, as shown in FIG. 2, the first substrate 1 and the second substrate 2 are combined by locally radiating the glass frits 5 using a laser radiator 6. The laser can be radiated on the second substrate 2 from an upper direction, but is not limited thereto. Alternatively, the laser may be radiated on the first substrate 1 from a lower direction, or may be radiated simultaneously on the second substrate 2 from the upper direction and the first substrate 1 from the lower direction.

When the laser radiator 6 has a single radiation head, laser is radiated onto the glass frits 5 around n unit cells arranged in the second direction Y in the first column of m unit cells arranged in the first direction X, and then onto n unit cells arranged in the second direction Y in the second column of m unit cells arranged in the first direction X. Accordingly, the laser radiator 6 is moved in the first direction X in the laser radiating process.

The first direction X and the second direction Y may be reversed.

When combining the first substrate 1 and the second substrate 2 by melting the glass frits 5, a laser having a first intensity is radiated. The first intensity of the laser varies according to the beam size of the laser and the characteristics of the glass frits. In addition, the first intensity of the laser may vary according to the composition of the glass frits 5 and the compositions of the first and second substrates 1 and 2 that are combined by the glass frits 5. In one embodiment, the first intensity of the laser may be high enough to melt the glass frits 5 so as to combine the first and second substrates 1 and 2.

Figure 3:
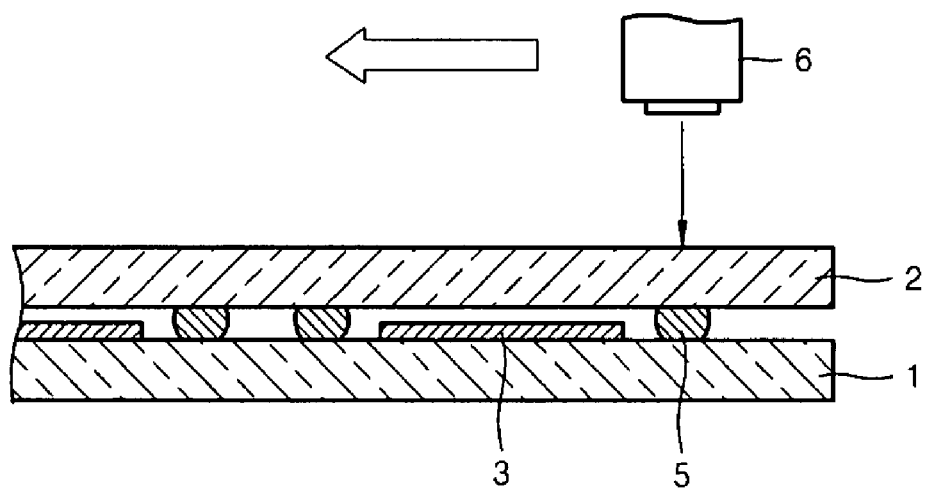
FIG. 3 is a sectional view of the substrates taken along line II-II in FIG. 1 when an annealing process is performed.

After the first substrate 1 and the second substrate 2 are combined by melting the glass frits 5 by radiating the laser having the first intensity, as shown in FIG. 3, the first substrate 1 or the second substrate 2 is annealed by radiating a laser having a second intensity onto the glass frits 5.

The intensity of the laser radiated for the annealing process, i.e., the second intensity of the laser, may differ from the first intensity of the laser radiated to combine the first and second substrates 1 and 2. In particular, the second intensity of the laser may be smaller than the first intensity of the laser. For example, the second intensity of the laser may be from about 70% to about 80% of the first intensity of the laser. In another embodiment, the laser radiator 6 emits, during a period of time, a first laser beam which is configured to melt the grass frits 5 and combine the first and second substrates 1 and 2. The laser radiator 6 further emits, after the period of time, a second laser beam toward an area where the first laser beam was radiated so as to anneal at least one of the first and second substrates. In this embodiment, the intensity of the second laser beam is less or substantially less than that of the first laser beam.

In the annealing process, the laser having the second intensity may be radiated in a substantially opposite direction to the radiation of the laser having the first intensity.

In other words, as shown in FIG. 1, the laser having the first intensity is radiated in the first direction X in the process of combining the first and second substrates 1 and 2. Accordingly, the direction in which the laser having the second intensity is radiated in the annealing process may be substantially opposite to the first direction X in which the laser having the first intensity is radiated in the process of combining the first and second substrates 1 and 2.

In particular, the laser having the second intensity can be radiated in the annealing process in an opposite direction to the radiation of the laser having the first intensity in the above-described substrate combining process. However, the radiation direction of the laser having the second intensity may be not exactly opposite to the radiation direction of the laser having the second intensity. In other words, the radiation direction of the laser in the annealing process may be substantially opposite to the radiation direction of the laser in the substrate combining process. In other words, when the radiation direction of the laser in the substrate combining process is the first direction X as described above, the radiation direction of the laser in the annealing process may be opposite to the first direction X.

The annealing process may be performed while varying the direction in which the laser radiator 6 is moved. However, the annealing process may be performed in a condition in which the direction in which the laser radiator 6 is moved is fixed. In this case, only the intensity of the laser is controlled after the first and second substrates 1 and 2 are rotated by 180°.

Figure 5:
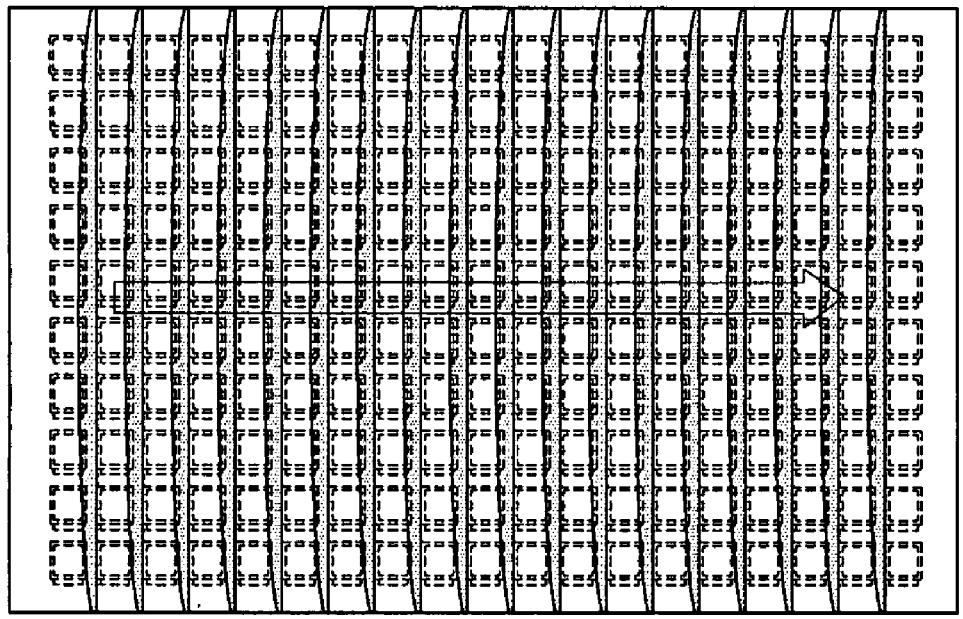
FIG. 5 is a schematic plan view illustrating the shape of protrusions that are formed on a cut face of a second substrate when the second substrate is cut immediately after a substrate combining process.
Figure 6:
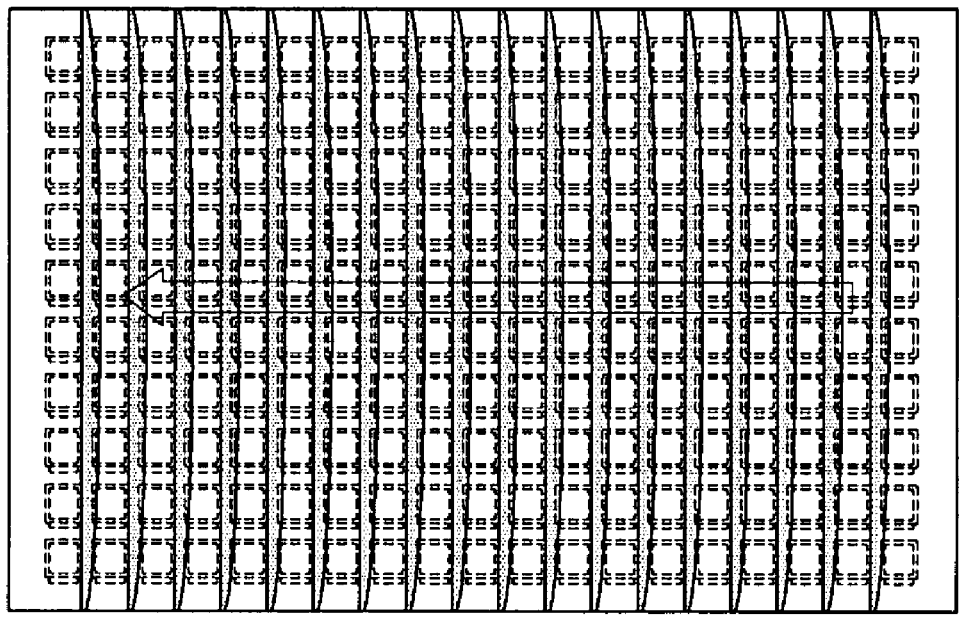
FIG. 6 is a schematic plan view illustrating the shape of protrusions that are formed on a cut face of a second substrate when the second substrate is cut after an annealing process.

When the second substrate 2 is cut immediately after the above-described substrate combining process, protrusions, which protrude in a direction opposite to the first direction X, are formed on the cut face of the second substrate 2. As laser is sequentially radiated onto unit cells in the first direction X, thermal stress caused by the laser exerts on portions of the first and second substrates 1 and 2 in adjacent unit cells, which increases toward the first direction X in which the laser is radiated. FIG. 5 illustrates the direction in which particles or protrusions protrude on a cut face of the second substrate 2 that is cut immediately after the radiation of the laser in the substrate combining process.

The generation of particles or protrusions on the cut face of the second substrate 2 can be prevented by the above-described annealing process.

As described above, when an annealing process is performed by radiating a laser having a second intensity in an opposite direction to the substrate combining process, a problem of locally imbalanced thermal stress exerting on the first and second substrates 1 and 2 can be solved. FIG. 2 illustrates the direction in which particles or protrusions protrude on a cut face of the second substrate 2 that is cut after the radiation of the laser in the annealing process.

If a substrate is cut after the annealing process, cracks may occur in an expected direction so that a smooth cut face can be obtained.

In addition, the intensity of the laser radiated in the annealing process may be smaller than the intensity of the laser radiated in the substrate combining process so as to prevent the glass frits 5 combining the two substrates 1 and 2 from remelting.

Figure 7:
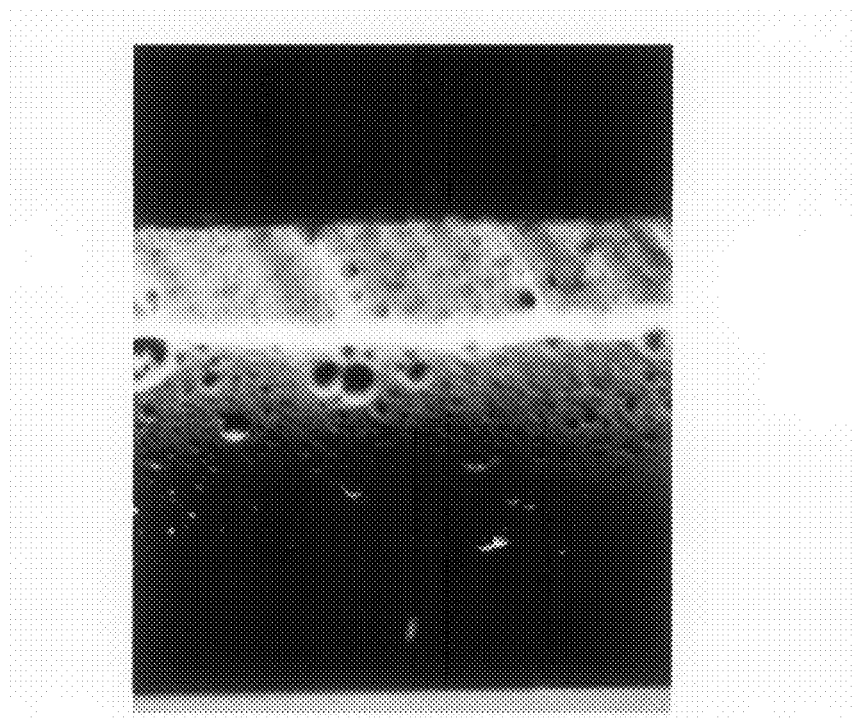
FIG. 7 is a photograph of a cut face of a second substrate that is cut immediately after a substrate combining process is performed without an annealing process.
Figure 8:
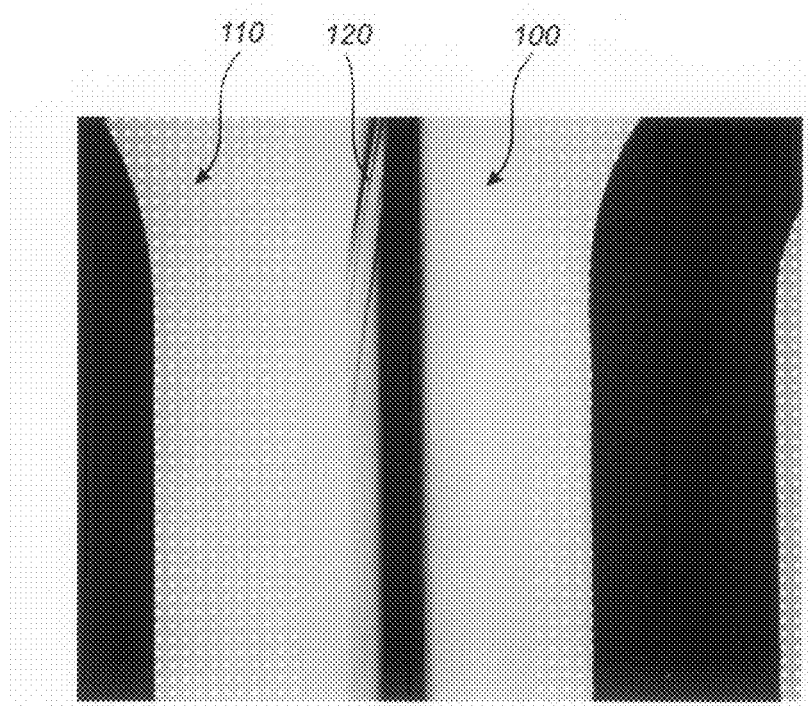
FIG. 8 is a photograph of a cut face of a second substrate that is cut immediately after a substrate combining process is performed without an annealing process, showing cracking on the second substrate.

FIG. 7 is a photograph of a cut face of the second substrate 2 that is cut immediately after the substrate combining process is performed without an annealing process. FIG. 8 is a photograph of a cut face of the second substrate 2 that is cut after only the substrate combining process, not the annealing process, is performed, showing cracking on the second substrate 2.

In FIG. 7, an upper portion that seems to be hatched is a portion into which a cutter is directly inserted, and a lower portion is a portion that is separated due to cracking caused by the insertion of the cutter into the upper portion.

As is apparent from FIG. 7, when combining the first and second substrates 1 and 2 by melting the glass frits 5 using laser, due to the radiation of laser in one direction, imbalanced thermal stress exerts on the glass so that irregular protrusions are formed on the cut face of a substrate, which is an inevitable failure. Referring to FIG. 7, the portion that is separated due to cracking includes dark portions, indicating that the cut face is not smooth and has protrusions.

Such irregular protrusions can be removed by a surface polishing process that is performed after the first and second substrates 1 and 2, i.e., the glass, are cut. However, a common surface polishing process is a wet process that mostly cannot be used for organic light emitting display devices, which require sealing and avoid a wet process.

FIG. 8 shows an example of cracking in one direction when an annealing process as in the present invention is not performed. As shown in FIG. 8, cracks 120 occur from a later laser-sealed portion 100 to an earlier laser-sealed portion 110.

Figure 9:
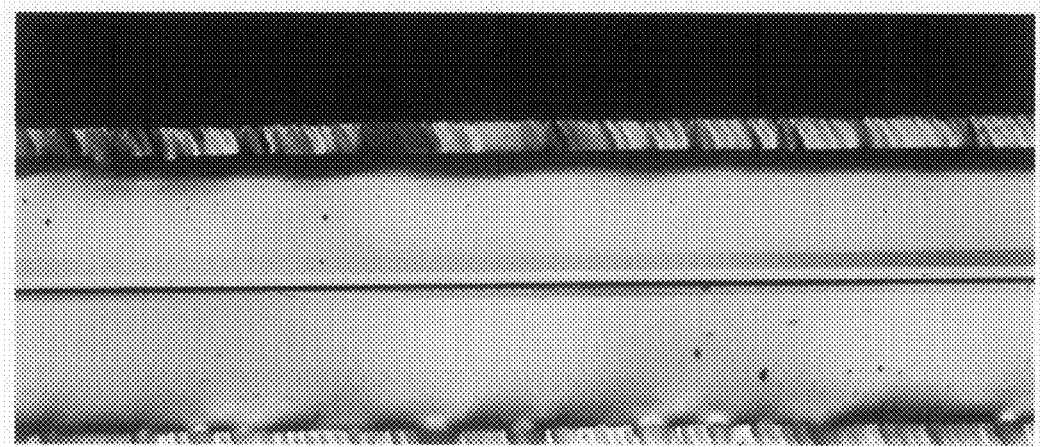
FIG. 9 is a photograph of a cut face of a second substrate that is cut after an annealing process.

Such inevitable failures occurring in a substrate combining process using glass frits can be solved by an annealing process as in one embodiment of the present invention, so that a smooth cut face can be obtained, as shown in FIG. 9.

Thus, according to at least one embodiment of the present invention, product quality can be simply improved.

In an embodiment of the present invention, the laser radiator 6 may have a multi-head having at least two radiating heads.

Figure 10:
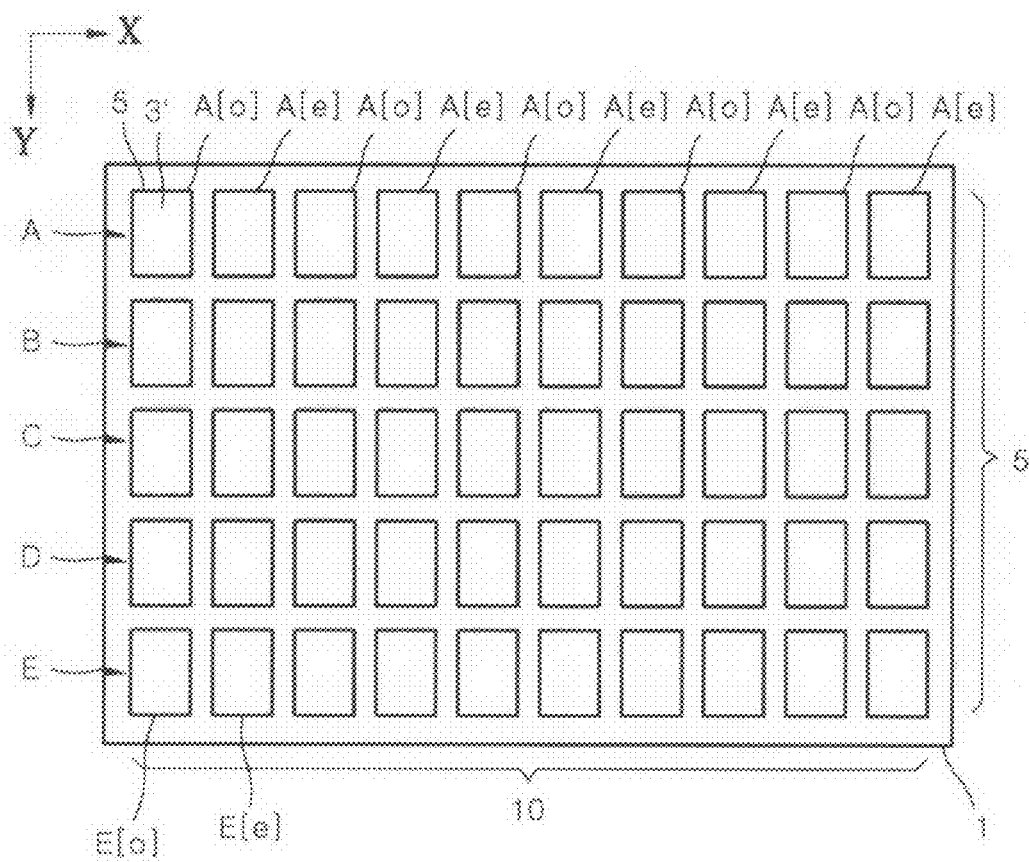
FIG. 10 is a schematic view for explaining the order of laser radiation onto cells using a multi-head.

FIG. 10 is a schematic view of cells 3' on the first substrate 1, which is subjected to laser radiation, for explaining the order of laser radiation onto cells using a multi-head. In FIG. 10, the glass frits 5 to be subjected to laser radiation are just drawn by line. Five rows A to E are arranged in the second direction (Y). The multi-head can simultaneously radiate laser onto a total of 5 alternate cells in each row. Accordingly, in the embodiment of FIG. 10, when radiating a laser onto row A, the laser can be simultaneously radiated onto five odd columns A[o] or five even columns A[e].

Using such a multi-head, a laser for combining substrates is radiated onto the cells 3' in the odd columns A[o] in row A. The heat generated by the radiation of the laser is transmitted to the cells 3' in the even columns A[e] in row A, providing an effect of indirect laser radiation on the cells 3' in the even columns A[e], and thus primarily changing thermal characteristics of the cells 3'.

Next, the multi-head radiates laser for combining substrates onto the cells 3' in the even columns A[e] in row A. Here, the thermal characteristics of the cells 3' in the even columns A[e] in row A are directly changed by the laser.

Thus, the cells 3' in the even columns A[e] undergo thermal hysteresis twice. Meanwhile, since the cells 3' in the odd columns A[o]) irradiated by the laser for combining substrates underwent serious changes in thermal characteristics, the cells 3' in the odd columns A[o]) are less affected by the heat transmitted when the laser for combining substrates is secondarily radiated onto the cells 3' in the even columns A[e]. Consequently, the glass strength of the second substrate 2 is greater near the cells 3' in the even columns A[e] than near the cells 3' in the odd columns A[o], so that cracking occurs toward the odd columns A[o] when the second substrate 2 is scribed. As a result, the sizes of the cells 3' in the even columns A[e] become larger than the sizes of the cells 3' in the odd columns A[o]. To prevent this problem, in one embodiment of the present invention, after a laser for combining substrates is radiated, a laser for annealing is radiated onto the cells 3' in an opposite direction to the laser radiation for combining substrates. In one embodiment, as shown In FIG. 10, annealing is performed on unit cells in the order of the even columns and odd columns in row E, the even columns and odd columns in row D, and the even columns and odd columns in row A.

Table 1 shows deviations in cell size in an 8×18 cell array caused due to glass cutting failures when annealing is not performed after a laser for combining substrates is radiated by a multi-head that can simultaneously radiate a laser onto nine rows. The 8×18 cell array included 18 columns A to R in the first direction (X) shown in FIG. 10 and 8 rows in the second direction (Y). The target cell size was 37.98 mm.

applied to various flat panel display devices, such as LCDs, inorganic light emitting display devices, and other flat display devices either currently available or to be developed in the future.

According to at least one embodiment, the substrate cutting quality can be simply improved.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method of manufacturing a flat panel display device, the method comprising:

TABLE 1

|   | A | B | C | D | E | F | G | H | I | J | K | L | M | N | O | P | Q | R |
|---|---|---|---|---|---|---|---|---|---|---|---|---|---|---|---|---|---|---|
| 1 | 37.91 | 38.06 | 37.82 | 38.1 | 37.85 | 38.06 | 37.83 | 38.11 | 37.84 | 38.19 | 37.83 | 38.1 | 37.79 | 38.11 | 37.82 | 38.12 | 37.81 | 37.99 |
| 2 | 37.9 | 38.07 | 37.86 | 38.07 | 37.81 | 38.07 | 37.79 | 38.07 | 37.83 | 38.16 | 37.81 | 38.03 | 37.83 | 38.09 | 37.85 | 37.81 | 37.81 | 37.99 |
| 3 | 37.85 | 38 | 37.88 | 38.07 | 37.82 | 38.11 | 37.83 | 38.08 | 37.82 | 38.13 | 37.81 | 38.07 | 37.81 | 38.09 | 37.77 | 37.8 | 37.8 | 37.95 |
| 4 | 37.89 | 38.04 | 37.85 | 38.02 | 37.83 | 38.05 | 37.8 | 38.05 | 37.83 | 38.04 | 37.8 | 38.04 | 37.81 | 38.11 | 37.85 | 37.8 | 37.8 | 37.93 |
| 5 | 37.87 | 38.06 | 37.8 | 38.02 | 37.9 | 38.13 | 37.79 | 38.06 | 37.83 | 38.11 | 37.81 | 38.1 | 37.83 | 38.12 | 37.82 | 37.81 | 37.81 | 37.97 |
| 6 | 37.88 | 38.01 | 37.8 | 38.02 | 37.88 | 38.12 | 37.79 | 38.06 | 37.83 | 38.16 | 37.83 | 38.06 | 37.86 | 38.12 | 37.82 | 37.84 | 37.84 | 37.95 |
| 7 | 37.85 | 38.07 | 37.78 | 38.04 | 37.84 | 38.08 | 37.8 | 38.08 | 37.81 | 37.98 | 37.8 | 38.12 | 37.8 | 38.13 | 37.86 | 37.81 | 37.81 | 37.96 |
| 8 | 37.89 | 38.06 | 37.83 | 38.06 | 37.82 | 38.05 | 37.84 | 38.13 | 37.82 | 38.16 | 37.81 | 38.1 | 37.81 | 38.15 | 37.83 | 37.81 | 37.81 | 37.95 |

Table 1 shows that many cells in even columns became larger.

Table 2 shows cell sizes after annealing is performed in the same manner as in the embodiment of FIG. 10 described above under the same conditions as described in connection with Table 1.

forming a plurality of light emitting units on a first substrate, each of the plurality of light emitting units including a light emitting element;

providing a second substrate;

placing glass frits between the first and second substrates;

TABLE 2

|   | A | B | C | D | E | F | G | H | I | J | K | L | M | N | O | P | Q | R |
|---|---|---|---|---|---|---|---|---|---|---|---|---|---|---|---|---|---|---|
| 1 | 37.87 | 37.82 | 37.92 | 37.86 | 37.87 | 37.83 | 37.88 | 37.8 | 37.82 | 37.8 | 37.85 | 37.81 | 37.82 | 37.76 | 37.79 | 37.79 | 37.78 | 37.84 |
| 2 | 37.92 | 37.9 | 37.88 | 37.83 | 37.87 | 37.87 | 37.97 | 37.87 | 37.82 | 37.82 | 37.81 | 37.82 | 37.8 | 37.78 | 37.81 | 37.82 | 37.82 | 37.79 |
| 3 | 37.84 | 37.91 | 37.94 | 37.85 | 37.88 | 37.83 | 37.93 | 37.9 | 37.86 | 37.77 | 37.8 | 37.77 | 37.79 | 37.83 | 37.81 | 37.79 | 37.81 | 37.82 |
| 4 | 37.91 | 37.86 | 37.87 | 37.91 | 37.9 | 37.85 | 37.92 | 37.86 | 37.87 | 37.81 | 37.84 | 37.83 | 37.84 | 37.81 | 37.83 | 37.8 | 37.8 | 37.36 |
| 5 | 37.91 | 37.87 | 37.84 | 37.83 | 37.9 | 37.85 | 37.86 | 37.83 | 37.86 | 37.82 | 37.82 | 37.76 | 37.8 | 37.79 | 37.81 | 37.26 | 37.8 | 37.87 |
| 6 | 37.92 | 37.88 | 37.85 | 37.87 | 37.88 | 37.88 | 37.8 | 37.86 | 37.92 | 37.79 | 37.88 | 37.79 | 37.87 | 37.82 | 37.83 | 37.79 | 37.81 | 37.86 |
| 7 | 37.85 | 37.82 | 37.89 | 37.88 | 37.91 | 37.87 | 37.88 | 38.08 | 37.87 | 37.92 | 37.81 | 37.78 | 38.01 | 37.93 | 37.83 | 37.94 | 37.9 | 37.97 |
| 8 | 37.9 | 37.92 | 37.91 | 37.86 | 37.9 | 37.87 | 37.85 | 38.13 | 37.8 | 37.81 | 37.82 | 37.83 | 37.83 | 37.81 | 37.84 | 37.79 | 37.8 | 37.85 |

As is apparent from Table 2, the cell size deviation markedly is reduced when annealing is performed. This is because the thermal hysteresis between adjacent cells is compensated for by annealing.

As described above, the present invention is not limited only to organic light emitting display devices, and thus can be radiating a first laser beam, having a first intensity, on one of the first and second substrates, so as to melt the glass frits and combine the first and second substrates; and radiating a second laser beam, having a second intensity, on the area where the first laser beam has been radiated, so as to anneal the first or second substrate, wherein the second intensity is different from the first intensity, and wherein the second laser beam is radiated in a substantially opposite direction to the direction of radiation of the first laser beam.

2. The method of claim 1, wherein the second intensity is less than the first intensity.

3. The method of claim 2, wherein the second intensity is from about 70% to about 80% of the first intensity.

4. The method of claim 1, wherein, in the forming of the plurality of light emitting units, m light emitting units are arranged in a first direction, and n light emitting units are arranged in a second direction,
the melting of the glass frits is performed in the first direction, and
the annealing of the first or second substrate is performed in an opposite direction to the first direction.

5. The method of claim 1, wherein, in the forming of the plurality of light emitting units, m light emitting units are arranged in a first direction, and n light emitting units are arranged in a second direction,
the melting of the glass frits is performed by repeatedly radiating the first laser beam in the second direction and then in the first direction, and
the annealing of the first or second substrate is performed by repeatedly radiating the second laser beam in the second direction and then in an opposite direction to the first direction.

6. The method of claim 1, wherein, in the melting of the glass frits and the annealing of the first or second substrate, the first and second laser beams are radiated onto a number of glass fits corresponding to at least two light emitting units at a time.

7. The method of claim 6, wherein, in the forming of the plurality of light emitting units, m light emitting units are arranged in a first direction, and n light emitting units are arranged in a second direction,
the melting of the glass frits is performed by radiating the first laser beam onto a column of light emitting units in the first direction and then onto a next column of light emitting units in the second direction, and
the annealing of the first or second substrate is performed by radiating the second laser beam in a direction opposite to the melting of the glass frits.

8. The method of claim 1, further comprising rotating the first and second substrates by about 180° after the combining of the first and second substrates by way of the first laser beam.

9. The method of claim 8, wherein, in the combining of the first and second substrates and the annealing of the first or second substrate, a laser radiator is moved in the same direction.

10. The method of claim 1, wherein the first laser beam or the second laser beam is radiated onto at least one of the first and second substrates.

11. The method of claim 1, further comprising cutting the first or second substrate so as to separate the light emitting units after the annealing of the first or second substrate.

12. The method of claim 1, wherein the at least one light emitting element is an organic light emitting element.

13. The method of claim 1, wherein the first and second laser beams are radiated from a single laser device.

14. A flat panel display device manufactured by a method, the method comprising:
providing first and second substrates, wherein a glass fit is formed on one of the substrates;
radiating, during a period of time, a first laser beam which is configured to melt the frit and combine the first and second substrates; and
radiating, after the period of time, a second laser beam toward at least one of the first and second substrates, on the area where the first laser beam has been radiated, so as to anneal the first or second substrate, wherein the intensity of the first laser beam is different from that of the second laser beam, and wherein the second laser beam is radiated in a substantially opposite direction to the direction of radiation of the first laser beam.

15. The flat panel display device of claim 14, wherein the first laser beam has an intensity which is substantially greater than that of the second laser beam.

16. The flat panel display device of claim 14, wherein the second intensity is from about 70% to about 80% of the first intensity.

17. The flat panel display device of claim 14, the second laser beam is configured to anneal at least one of the first and second substrates.

18. A method of manufacturing a flat panel display device, the method comprising:
providing a glass frit between first and second substrates;
radiating a first laser beam, having a first intensity, on one of first and second substrates so as to melt the glass frit and combine the first and second substrates; and
radiating a second laser beam, having a second intensity, on the first radiated region, so as to anneal the first or second substrate, wherein the second intensity is substantially less than that of the first intensity, and wherein the second laser beam is radiated in a substantially opposite direction to the direction of radiation of the first laser beam.

* * * * *